(12) United States Patent
Kweon et al.

(10) Patent No.: US 7,211,901 B2
(45) Date of Patent: *May 1, 2007

(54) SELF-COPLANARITY BUMPING SHAPE FOR FLIP CHIP

(75) Inventors: Young-Do Kweon, Cupertino, CA (US); Rajendra D. Pendse, Fremont, CA (US); Nazir Ahmad, San Jose, CA (US); Kyung-Moon Kim, Ichon-si (KR)

(73) Assignee: ChipPAC, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/145,246

(22) Filed: Jun. 3, 2005

(65) Prior Publication Data

US 2005/0218515 A1    Oct. 6, 2005

Related U.S. Application Data

(63) Continuation of application No. 10/080,384, filed on Feb. 22, 2002, now Pat. No. 6,940,178.

(60) Provisional application No. 60/272,240, filed on Feb. 27, 2001.

(51) Int. Cl.
H01L 23/52 (2006.01)
H01L 23/48 (2006.01)
H01L 23/40 (2006.01)
H01L 23/485 (2006.01)
H01L 23/498 (2006.01)

(52) U.S. Cl. .............. 257/780; 257/779; 257/737; 257/738; 257/E23.021; 257/E23.069; 438/612; 438/613

(58) Field of Classification Search ........ 257/737–738, 257/779–780, E23.021, E23.023, E23.069; 438/612–613
See application file for complete search history.

(56) References Cited

U.S. PATENT DOCUMENTS 4,000,842 A * 1/1977 Burns .................. 228/180.21

(Continued)

FOREIGN PATENT DOCUMENTS

JP    2000-299338 A    10/2000

*Primary Examiner*—Luan Thai
(74) *Attorney, Agent, or Firm*—Bill Kennedy; Haynes Beffel & Wolfeld LLP

(57) ABSTRACT

A stud bump structure for electrical interconnection between a pair of members includes a base portion, and a stem portion. The base portion is affixed to a pad or trace in one of the pair of members to be interconnected (such as an integrated circuit chip), and the stem end is configured to contact a metal pad on the other member (such as a printed circuit board) to complete the interconnect. According to the invention, the stem end is truncated to form a transverse plane, and the stem is more compliant than the base. Also, a method for forming a stud bump on a contact surface, includes forming a bump base portion on the surface, drawing out a generally conical tail from a top of the base, and truncating the tail to form a stem portion having a planar transverse top surface and having a length from the top of the base portion to the top surface. In some embodiments the tail portion, at least, of the stud bump is formed using a wire bonding tool. Also, a method for forming an interconnect between a first member and a second member of an electronic package includes providing one of the members with the stud bumps of the invention and then bringing the corresponding bumps and pads together in a bonding process, the compliance of the stems portions of the bumps accommodating the variance from coplanarity of the pad surfaces.

9 Claims, 1 Drawing Sheet

U.S. PATENT DOCUMENTS

| | | |
|---|---|---|
| 4,208,005 A | 6/1980 | Nate et al. |
| 4,818,728 A | 4/1989 | Rai et al. |
| 5,210,938 A | 5/1993 | Hirai |
| 5,250,469 A | 10/1993 | Tanaka et al. |
| 5,346,857 A | 9/1994 | Scharr et al. |
| 5,386,624 A | 2/1995 | George et al. |
| 5,508,561 A | 4/1996 | Tago et al. |
| 5,592,736 A | 1/1997 | Akram et al. |
| 5,633,204 A * | 5/1997 | Tago et al. ............. 438/614 |
| 5,686,317 A | 11/1997 | Akram et al. |
| 5,717,477 A | 2/1998 | Fritz et al. |
| 5,801,350 A | 9/1998 | Shibuya et al. |
| 5,829,126 A | 11/1998 | Nagao et al. |
| 5,865,365 A | 2/1999 | Nishikawa et al. |
| 5,869,904 A | 2/1999 | Shoji |
| 5,874,780 A | 2/1999 | Murakami |
| 5,875,100 A * | 2/1999 | Yamashita ............. 361/764 |
| 5,889,326 A * | 3/1999 | Tanaka ................. 257/737 |
| 5,892,271 A | 4/1999 | Takeda et al. |
| 5,892,289 A | 4/1999 | Tokuno |
| 5,931,371 A | 8/1999 | Pao et al. |
| 5,953,814 A | 9/1999 | Sozansky et al. |
| 6,006,426 A * | 12/1999 | Kira et al. ............. 29/836 |
| 6,037,192 A | 3/2000 | Witzman et al. |
| 6,130,476 A | 10/2000 | LaFontaine, Jr. et al. |
| 6,153,940 A * | 11/2000 | Zakel et al. ............. 257/779 |
| 6,163,463 A * | 12/2000 | Marrs .................... 361/773 |
| 6,173,887 B1 | 1/2001 | Mead et al. |
| 6,214,642 B1 | 4/2001 | Chen et al. |
| 6,225,144 B1 | 5/2001 | How et al. |
| 6,326,234 B1 | 12/2001 | Nakamura |
| 6,333,554 B1 * | 12/2001 | Kitajima et al. ......... 257/737 |
| 6,337,522 B1 | 1/2002 | Kang et al. |
| 6,376,352 B1 * | 4/2002 | Arnold et al. ........... 438/612 |
| 6,459,592 B1 | 10/2002 | Anzai |

* cited by examiner

SELF-COPLANARITY BUMPING SHAPE FOR FLIP CHIP

CROSS REFERENCE TO RELATED APPLICATION

This application is a Continuation of U.S. application Ser. No. 10/080,384, filed Feb. 22, 2002 now U.S. Pat. No. 6,940,178, which claimed priority from Provisional Application No. 60/272,240, filed Feb. 27, 2001.

BACKGROUND

This invention relates to forming electrical interconnection between an integrated circuit chip and a substrate. In particular, the invention relates to interconnecting an integrated circuit chip with the substrate in a flip chip semiconductor device package.

Interconnection between an integrated circuit chip and a substrate such as a printed circuit substrate is commonly formed during assembly of the device package. In a commonly used interconnection method, gold bumps are mounted on the integrated circuit chip in an arrangement corresponding to the arrangement of metal contact pads on the substrate. During package assembly the chip and the substrate are apposed with the corresponding bumps and pads aligned; then the chip and substrate are brought together under conditions (temperature, pressure, untrasonic vibration) that promote bonding of the bumps onto the metal pads.

The surfaces of the integrated circuit chip and the substrate are not uniformly flat. The substrate, which may be formed of an organic polymer, may have a particularly nonflat surface, particularly where the substrate is fabricated using a lower cost process. The substrate surface may be warped or may otherwise have irregularities. Accordingly, the surfaces of the metal contact pads on the substrate may be noncoplanar. As a result, when the surfaces of the chip and the substrate are apposed, the various metal pad surfaces are at different distances from the corresponding contact surfaces of the chip. Because of this irregularity, when the chip and the substrate are brought together, some of the bumps may fail to make good contact with their corresponding pads, resulting in a nonfunctioning package.

There is a continual demand in industry for reduced size in semiconductor packages. As packages are made smaller, the interconnect structures are also made smaller and the clearance between the chip and the substrate becomes narrower. Where the clearance between the chip and the substrate is very narrow even comparatively slight noncoplanarities of the substrate surface become significant, and can result in an unacceptable rate of interconnect failure during package construction.

There is a need for improved reliability in construction of robust interconnects in electronic chip package assembly.

SUMMARY

According to the invention, a stud bump structure includes a base portion, and a stem portion. The base portion is affixed to a pad or trace in one of a pair of members to be interconnected (such as an integrated circuit chip), and the stem end is configured to contact a metal pad on the second member (such as a printed circuit board) to complete the interconnect. According to the invention, the stem end is truncated to form a transverse plane, and the stem is more compliant than the base. The difference in compliance may be provided by forming the stem with a smaller diameter than that of the base. Or, the difference in compliance may be provided by forming the stem of a more compliant material than that of the base. The first and second members are apposed, with the stud bumps on the first member in alignment with the corresponding metal pads on the second member. The members are moved toward one another under conditions that favor bonding of the stud bump stems onto the metal pads. Because the surfaces of the members are not uniformly flat, when the surfaces are moved toward one another certain of the stems contact their corresponding pads before others do; these stems are deformed as the surfaces are moved closer together and still more of the stems make contact with their corresponding pads; eventually all of the stems have contacted and bonded with their corresponding pads. The stud bump bases, being less compliant than the stems, substantially maintain their shape during stem deformation, and the bases can provide a stop, preventing further movement together of the first and second members and ensuring that a minimum distance between the surfaces (apart from the bumps and pads) is maintained. The extent to which the stem portion of the stud bump may be shortened in the deformation process provides a practical tolerance for noncoplanarity of the metal pad surfaces.

The stud bump structure according to the invention is particularly useful in interconnects for very thin flip chip packages, in which the first member is an integrated circuit chip, and second member is a substrate such as a printed circuit substrate.

In one general aspect the invention features a stud bump structure comprising a base portion, affixed to one member of an interconnect pair (such as a integrated circuit chip), and a stem portion, in which the stem portion has a transverse planar top surface configured to contact a metal pad on a second member of an interconnect pair (such as a printed circuit board substrate). The stem portion is more compliant than the base portion, so that under pressure applied against the top surface toward the base, under conditions that promote bonding of the stem with the pad, the stem portion deforms and becomes shorter, while the base portion remains substantially undeformed.

In some embodiments the bump base portion comprises a first material and the stem portion comprises a second material, and the second material is more compliant than the first material. Because the second material is more compliant than the first, pressure applied against a top surface of the stem portion, toward the base, can (under conditions that promote bonding of the stem with the pad) result in deformation of the stem portion, so that it becomes progressively shorter, while the base portion remains substantially undeformed. In some embodiments the first material comprises nickel or a nickel alloy or copper or a copper alloy; and the second material comprises a solder or gold or a gold alloy. In embodiments in which the second material comprises a solder, the conditions that promote bonding of the stem with the pad include applying sufficient heat to fuse the solder with the pad.

In some embodiments the bump base portion comprises a material having a compliance characteristic either the same as or similar to or different from that of the material of the stem, and may for example comprise substantially the same material as the stem portion. In such embodiments, at least the top surface of the stem has a smaller diameter than the base, so that although there is no difference in the compliance of the material, the stem is more compliant than the base because of its smaller diameter. A preferred material is gold, or a gold alloy.

The extent to which the stem may shorten as it is deformed during the bonding process establishes a limit on the range of noncoplanarity that may be tolerated for the given members that are being interconnected. Accordingly—assuming that the stem top surfaces of all the bumps on the first member are substantially planar—this shortening capacity (which may be referred to as the "Z-level adjustment") should be selected to be greater than the maximum range of noncoplanarity for the respective pads on the second member. This ensures in bonding of any given pair that shortening of the stem portion of the bump that contacts the pad that is nearest the first member surface will allow for good contact of a bump with the pad that is farthest from the first member surface. In other words, the Z-level adjustment provides for accommodation of the maximum degree of noncoplanarity of the pads, or between the first and second members.

In another general aspect the invention features a method for forming a stud bump on a contact surface, by forming a bump base portion on the surface, drawing out a generally conical tail from a top of the base, and truncating the tail to form a stem portion having a planar transverse top surface and having a length from the top of the base portion to the top surface. In some embodiments the tail portion, at least, of the stud bump is formed using a wire bonding tool, and the conical tail is dimensioned so that after truncating, the resulting top surface of the stem portion has a diameter at least about the same as a specified wire diameter and no greater than the diameter of the base, more usually at least about 2 times a specified wire diameter and no greater than the diameter of the base. The planar transverse stem top surface is an important feature according to the invention, as it improves the contact of the planar top surface with the metal pad during the bonding process, and can more reliably result in a more robust interconnect. In some embodiments the truncating includes chemical mechanical polishing.

During the bonding process, the base portion of the stud bump may be displaced or may expand to some extent. Although any such deformation is insubstantial in relation to the deformation of the stem portion of the stud bump, contact of the stud bump base with the surrounding passivation material on the first member might cause some disruption of the passivation material, or some degradation of the reliability of the passivation material, owing to pressure or thermal stress at the point of contact. In order to mitigate such effects, in some embodiments the base portion of the stud bump has a diameter no greater than 0.85 times the diameter of the opening in the passivation to the bond pad on the first member.

In another general aspect the invention features a method for forming an interconnect between a first member and a second member of an electronic package, by: providing a plurality of stud bumps on contact sites at specified locations on the first member, the stud bumps each having a base portion and a stem portion that is more compliant than the base portion, the stem portion having a transverse planar top surface; providing a second member having a plurality of bonding pads at specified locations on a surface of the second member, the respective specified locations on the first and second members corresponding; apposing the first and second members such that the corresponding bumps and pads are aligned; and bringing the first and second members together under conditions that promote bonding of the pumps onto the respective metal pads.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. Particularly, certain thickness dimensions are exaggerated in the FIGS. for purposes of illustration. For improved clarity of presentation, in the FIGS. illustrating embodiments of the invention, elements corresponding to elements shown in other drawings are not all particularly renumbered, although they are all readily identifiable in all the FIGS.

Figure 1:
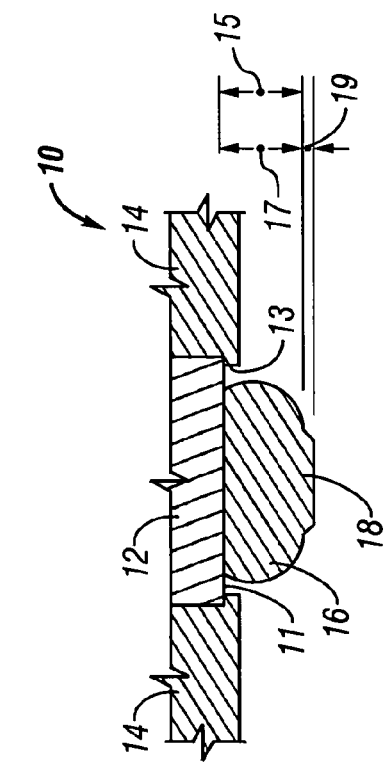
FIG. 1 is a diagrammatic sketch in a sectional view showing a conventional stud bump interconnect structure.

Turning now to FIG. 1, there is shown diagrammatically in a sectional view generally at 10 a conventional stud bump interconnect structure affixed to a contact surface at a selected contact site on an integrated circuit chip. Only a portion of the integrated circuit chip is shown, particularly, a contact site 12 which may for example be a conductive line such as an aluminum trace, and a passivation layer 14 having an opening 13 exposing a surface 11 of the conductive line. The stud bump 16 is formed in electrically conductive contact with the conductive line. The stud bump has a flattened spheroidal shape, as a slightly flattened sphere or a filled torus, and may as a manufacturing artifact have a vestigial slightly raised portion 18 that is a remnant of the process of forming the bump. The stud bump has an overall height 15 above the conductive line surface 11 that includes the height 19 of the slightly raised upper portion 18 and the height 17 of the flattened spheroidal bump 16 itself. The height 17 of the bump 16 differs for different package configurations, and particularly it is less for packages having a narrower clearance between the chip and the substrate to which the chip is to be interconnected. Where a vestigial slightly raised portion 18 is present on the bump, its height 19 is typically less than about one quarter of the base height; for example, a typical conventional bump having a height 17 about 25 microns will have no raised portion 18 or, if a raised portion is present it typically has a height 19 less than about 6 microns.

Conventionally, a stud bump 16 is formed by an adaptation of a wire bonding process using a wire bonding tool. Particularly, a wire bonding tool configured for forming a gold or gold alloy wire bond having a specified wire diameter is employed to form a roughly spherical (globular) wire end, which is contacted with the surface of the conductive line under conditions of force and temperature that promote bonding of the globular wire end onto the conductive line surface, and resulting in some degree of flattening of the globular wire end. Thereafter, the wire bonding tool is pulled away, and the wire portion is trimmed off close to the globular bump 16, leaving the residual portion 18.

Figure 2:
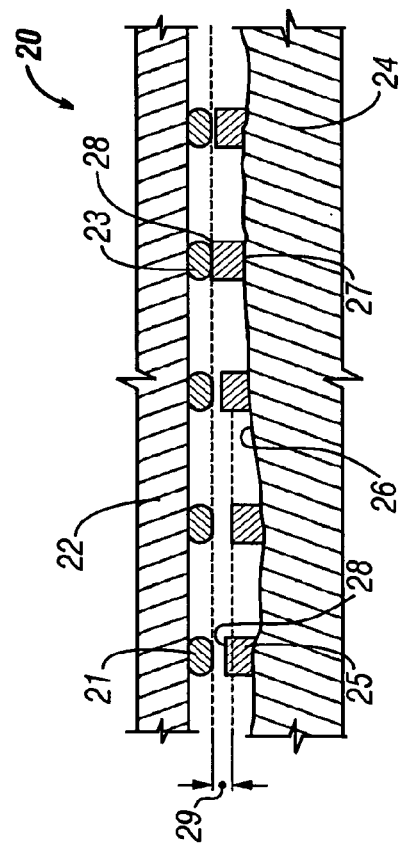
FIG. 2 is a diagrammatic sketch in a sectional view of a flip chip package employing stud bumps as in FIG. 1, showing interconnect failures owing to variation in coplanarity between the die and the substrate.

FIG. 2 is a diagrammatic sketch in a sectional view showing generally at 20 a result of a failed attempt to form an adequate interconnection between an integrated circuit chip, having conventional bumps as in FIG. 1, with a substrate having a corresponding arrangement of metal pads on a nonflat surface. In FIG. 2, an integrated chip indicated at 22 is provided with a number of conventional bumps, for example 21 and 23, affixed to contact sites, not shown in FIG. 2, in the integrated chip surface; and a substrate 24 is provided on a surface 26 with a number of metal pads, for example 25 and 27. The substrate surface 26 is, as may be expected as a result of ordinary fabrication processes, not flat; and, accordingly, the upper surfaces 28 of the metal pads, for example 25, 27, are noncoplanar. Particularly, when the surfaces of the integrated circuit chip and the substrate are apposed, certain of the pads (for example pad 27) are, because of the noncoplanarity, nearer the apposed integrated circuit chip surface than others (for example pad 25). As a result, when the integrated chip 22 and the substrate 24 are moved toward one another during the interconnect bonding stage of the package assembly process, contact of these more proximate pads (e.g., 27) with their respective bumps (e.g., 23) restricts further movement of the integrated chip 22 and the substrate 24 toward one another, and interferes with effective contact of the more distant pads (e.g., 25) with their respective bumps (e.g., 21), preventing the formation of robust interconnect at these points.

Improved interconnect formation on substrates having noncoplanar pad surfaces is provided according to the invention by employing stud bumps each having a base portion and a stem portion, in which the base portion is affixed to a conductive pad or trace on the integrated circuit chip and the stem portion is configured to contact a conductive pad on the substrate, and in which the stem portion is more compliant than the base. An embodiment of a stud bump according to the invention is shown by way of example in FIG. 3. The stud bump according to the invention includes base portion 36 and stem portion 38. Base portion 36 is affixed to a surface 11 on a conductive line 12 exposed within an opening 13 in a passivation material 14. Stem portion 38 is shaped generally as a truncated cone having a transverse planar top surface 39.

A stud bump according to the invention can conveniently be formed by an adaptation of a wire bonding process using a wire bonding tool. Particularly, a wire bonding tool configured for forming a gold or gold alloy wire bond having a specified wire diameter is employed to form a roughly spherical (globular) wire end, which is contacted with the surface of the conductive line under conditions of force and temperature that promote bonding of the globular wire end onto the conductive line surface, and resulting in some degree of flattening of the globular wire end. This somewhat flattened globular wire end constitutes the base portion 36 of the bump. Thereafter, the wire bonding tool is pulled away at a specified rate to form a roughly conical tail, generally as described for example in U.S. Pat. No. 5,874,780, herein incorporated by reference. Then the tail is trimmed, and the transverse planar top surface 39 is formed, for example by chemical mechanical polishing, resulting in the truncated roughly conical stem portion 38.

The stem portion 38 of the stud bump according to the invention is more compliant than the base portion 36.

The difference in compliance may result from a difference in material selected for forming the stem portion and the base portion. That is, the stem portion may be made of a material softer than that of the base portion under the conditions of interconnect bond formation. The base portion can be formed of nickel, or copper, or a nickel or copper alloy, for example; and the stem portion can be formed of a solder, or of gold or a gold alloy. Other combinations of materials may be used, selected for their having relatively different compliances under interconnect bond formation conditions. Where a solder is used as the stem portion, for example, the interconnect bond formation conditions will include heat treatment sufficient to melt and fuse the solder onto the pad, but not so high as to permit substantial deformation of the base portion. And where gold is used as the stem portion, for example, the interconnect bond formation conditions will include application of force sufficient to compress and shorten the stem portion, but not so great as to deform the base portions.

Figure 3:
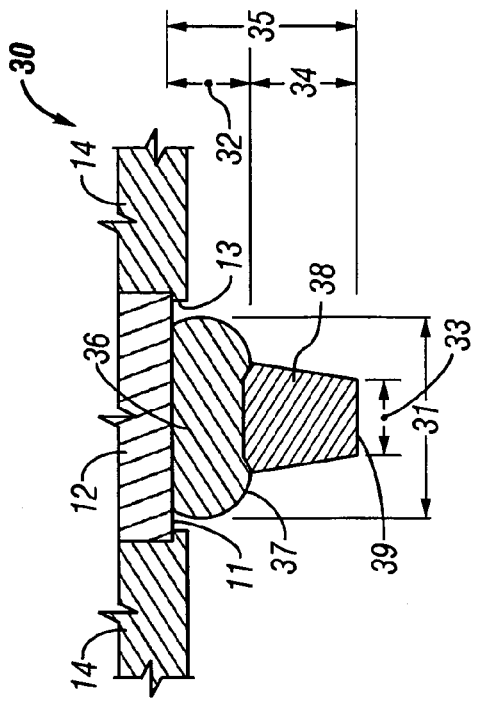
FIG. 3 is a diagrammatic sketch in a sectional view showing an embodiment of a stud bump interconnect structure according to the invention.

The difference in compliance may additionally or alternatively result from a difference in dimensions of the base and stem portions, as shown by way of example in FIG. 3. Particularly, for example, the diameter 33 of the surface 39 of the stem portion is significantly less than the diameter 31 of the base, as is the widest diameter of the stem portion, where it joins the base. A compressive force imposed against the top surface 39 of the stem portion and in the direction of the stem portion axis can, up to a limit of force, deform and shorten the stem without significantly deforming the base.

Because the base portions are substantially not compressible in a direction normal to the surfaces of the chip and of the substrate, the height 32 of the base portion establishes a practical lower limit on the clearance between the chip and the substrate surfaces. Similarly, although the stem portion is not infinitely compressible in a direction normal to the surfaces of the chip and of the substrate, the height 34 of the stem portion establishes a practical upper limit on the extent of pad surface noncoplanarity that can be tolerated.

Figure 4:
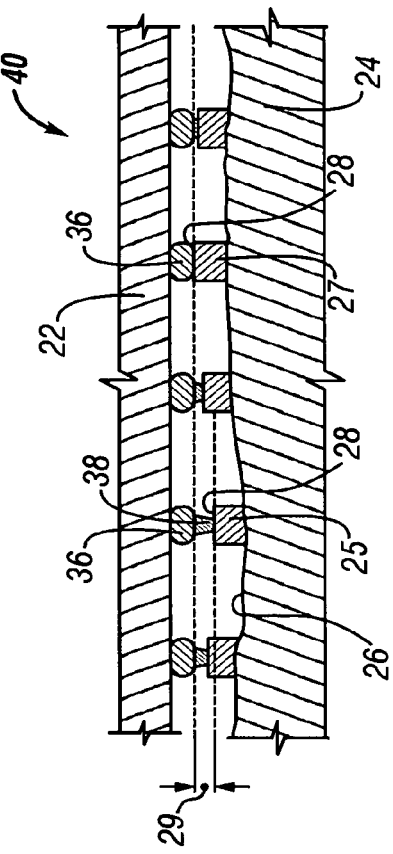
FIG. 4 is a diagrammatic sketch in a sectional view of a flip chip package employing stud bumps according to the invention, showing improved interconnection between the die and the substrate.

FIG. 4 diagrammatically illustrates generally at 40 a successful robust interconnect of an integrated chip with a nonflat substrate employing stud bumps according to the invention. Here integrated chip 22 is provided with a number of stud bumps according to the invention, each having a base portion 36 and the stem portion 38, affixed to contact sites, not shown in FIG. 4, in the integrated chip surface. A substrate 24 is provided on a surface 26 with a number of metal pads, for example 25 and 27. The substrate surface 27 is, as may be expected as a result of ordinary fabrication processes, not flat; and, accordingly the upper surfaces 28 of the metal pads, for example 25, 27, are noncoplanar. The maximum degree of noncoplanarity is shown as the dimension 29 in FIG. 4; that is the difference between the heights, in relation to the chip surface, of the pad surfaces 28 of the nearest pad 27 and of the farthest pad 25. As FIG. 4 shows, the stem portions 38 of the stud bumps according to the invention are made with sufficient height 34 and are made sufficiently more compliant than the base portions 36, that the farthest pad 25 has formed a robust bond with the top surface of the corresponding stud bump stem, while the nearest pad 27 has compressed its corresponding stud bump stem practically entirely its height to the upper limit of the base portion, which effectively serves as a stop for further compression.

EXAMPLE

In this example, the stud bump base and stem are formed of the same material, such as gold or a gold alloy, and the relative dimensions are selected so that the stem portion is more compliant than the base portion. In this example, design rules suitable according to the invention are as follows (with reference to FIGS. 3 and 4): the stem end 39 diameter 33 is greater than about twice the wire diameter; and the difference 34 (roughly the stem height) between the stud bump overall height 35 and the base height 32 is greater than the maximum coplanarity variation 29 of all pads 25 on the substrate 24; and the stem height 34 is at least about 1.5 times the base height and typically in the range about 1.5 and 3 times the base height. Optionally, the base 36 diameter 31 is less than about 0.85 times the diameter of the opening 13 in the passivation 14.

Other embodiments are within the following claims.

What is claimed is:

1. A flip chip semiconductor package, comprising an integrated circuit chip having a plurality of stud bumps on contact sites at specified locations on a surface thereof, the stud bumps each having a base portion and having a stem portion that is more compliant than the base portion, the stem portion having a transverse planar top surface; and a substrate having a plurality of bonding pads at specified locations on a surface of thereof, the respective specified locations on the integrated circuit chip and the substrate corresponding, the stem portions of the stud bumps on the chip being in electrical contact with the corresponding pads on the substrate, wherein the bonding pads are noncoplanar, and the stud bump stem height is greater than the maximum range of noncoplanarity of all the pads on the substrate.

2. The package of claim 1 wherein the base portion comprises a first material and the stem portion comprises a second material, and the second material is more compliant than the first material.

3. The package of claim 2 wherein the second material is selected from the group consisting of a solder, gold, and gold alloys.

4. The package of claim 2 wherein at least the top surface of the stem has a smaller diameter than the base.

5. The package of claim 1 wherein the bump base portion comprises a material having a similar compliance characteristic as the material of the stem, and wherein at least the top surface of the stem has a smaller diameter than the base.

6. The package of claim 5 wherein the bump base portion comprises a material having the same compliance characteristic as the material of the stem.

7. The package of claim 1 wherein the bump base portion comprises the same material as the stem portion.

8. The package of claim 1 wherein at least one of the bump base portion and the bump stem portion comprises gold or a gold alloy.

9. The package of claim 1 wherein the base portion is affixed to a conductive site exposed in an opening in a passivation material, and wherein a diameter of the base portion is less than 0.85 times a diameter of the opening in the passivation material.

* * * * *